(12) United States Patent
Yoshida et al.

(10) Patent No.: US 10,998,529 B2
(45) Date of Patent: May 4, 2021

(54) DISPLAY DEVICE, METHOD FOR PRODUCING DISPLAY DEVICE, AND APPARATUS FOR PRODUCING DISPLAY DEVICE

(71) Applicant: SHARP KABUSHIKI KAISHA, Sakai (JP)

(72) Inventors: Hidefumi Yoshida, Sakai (JP); Kiyoshi Minoura, Sakai (JP); Tokiyoshi Umeda, Sakai (JP); Kaoru Abe, Sakai (JP); Akira Sakai, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/766,506

(22) PCT Filed: Nov. 30, 2017

(86) PCT No.: PCT/JP2017/043056
§ 371 (c)(1),
(2) Date: May 22, 2020

(87) PCT Pub. No.: WO2019/106790
PCT Pub. Date: Jun. 6, 2019

(65) Prior Publication Data
US 2020/0381669 A1 Dec. 3, 2020

(51) Int. Cl.
*H01L 51/52* (2006.01)
*H01L 27/32* (2006.01)
*H01L 51/56* (2006.01)

(52) U.S. Cl.
CPC ...... *H01L 51/5284* (2013.01); *H01L 27/3206* (2013.01); *H01L 51/5265* (2013.01); *H01L 51/56* (2013.01)

(58) Field of Classification Search
CPC ......... G09F 9/00; G09F 9/30; H01L 51/5265; H01L 51/56; H01L 51/5284;
(Continued)

(56) References Cited

U.S. PATENT DOCUMENTS

| 4,641,156 A | * | 2/1987 | Ohta | ...................... G01D 15/14 347/224 |
| 6,147,740 A | | 11/2000 | Yoshida et al. | |

(Continued)

FOREIGN PATENT DOCUMENTS

| JP | H10-282498 A | 10/1998 |
| JP | 2005-063841 A | 3/2005 |

(Continued)

*Primary Examiner* — Hoan C Nguyen
(74) *Attorney, Agent, or Firm* — ScienBiziP, P.C.

(57) ABSTRACT

A display device, to provide compensation for change in color level due to different viewing directions of a display surface and compensation for other optical characteristics of the display surface in a compatible manner, includes a light-emitting element layer including a light-emitting layer including a light-emitting element, a first electrode disposed below the light-emitting layer, and a second electrode disposed above the light-emitting layer, wherein an optical compensation layer is disposed above the light-emitting element layer, the optical compensation layer being configured to compensate for prevention of external light reflection on a display surface and compensate for change in color level of the display surface due to different viewing directions of the display surface.

15 Claims, 15 Drawing Sheets

(58) Field of Classification Search
CPC .. H01L 27/3206; H01L 27/3211; G02F 1/137; G02F 1/1335; G02F 1/13363
See application file for complete search history.

(56) References Cited

U.S. PATENT DOCUMENTS

| | | | |
|---|---|---|---|
| 6,239,778 B1* | 5/2001 | Palffy-Muhoray | G02C 7/101 345/87 |
| 6,417,909 B1 | 7/2002 | Yoshida et al. | |
| 6,767,594 B1* | 7/2004 | Miroshin | G02B 5/3083 428/1.31 |
| 2005/0035353 A1 | 2/2005 | Adachi et al. | |
| 2009/0091690 A1* | 4/2009 | Matsubara | G02B 5/3083 349/96 |
| 2010/0072880 A1 | 3/2010 | Adachi et al. | |
| 2011/0122053 A1* | 5/2011 | Jeong | H01L 51/5275 345/76 |
| 2012/0154910 A1* | 6/2012 | Yajima | B29D 11/00644 359/487.02 |
| 2012/0257123 A1* | 10/2012 | Lee | G02F 1/13737 349/1 |
| 2012/0293733 A1* | 11/2012 | Li | G02F 1/13718 349/13 |
| 2013/0170044 A1* | 7/2013 | Mont | B82Y 20/00 359/580 |
| 2014/0092080 A1 | 4/2014 | Fukunaga et al. | |
| 2014/0340752 A1* | 11/2014 | Kusama | G02B 5/0236 359/599 |
| 2017/0250376 A1* | 8/2017 | Sasaki | H01L 51/5275 |
| 2018/0003860 A1* | 1/2018 | Cho | G02B 1/14 |
| 2018/0329125 A1* | 11/2018 | Hikita | H05B 33/04 |
| 2019/0137676 A1* | 5/2019 | Nam | C08L 83/04 |

FOREIGN PATENT DOCUMENTS

| | | | |
|---|---|---|---|
| JP | 2008040120 A | * | 2/2008 |
| JP | 2013-254651 A | | 12/2013 |
| JP | 2014-071372 A | | 4/2014 |
| JP | 2014-115576 A | | 6/2014 |
| JP | 2015-102811 A | | 6/2015 |
| JP | 2017-102443 A | | 6/2017 |
| JP | 2017-152251 A | | 8/2017 |
| WO | 2017/086338 A1 | | 5/2017 |

* cited by examiner

DISPLAY DEVICE, METHOD FOR PRODUCING DISPLAY DEVICE, AND APPARATUS FOR PRODUCING DISPLAY DEVICE

TECHNICAL FIELD

The present disclosure relates to a display device including a light-emitting element.

BACKGROUND ART

PTL 1 describes a display device including dichroic pigment to compensate for change in hue due to different viewing directions.

CITATION LIST

Patent Literature

PTL 1: JP 2015-102811 A (published on Jun. 4, 2015)

SUMMARY

Technical Problem

The display device in PTL 1 has been made without sufficiently taking into account optical characteristics such as external light reflection. Thus, for the display device of PTL 1, compensating for change in hue due to different viewing directions does not result in sufficient compensation for optical characteristics of the display surface.

Solution to Problem

To solve the problem described above, a display device includes a light-emitting element layer including a light-emitting layer including a light-emitting element, a first electrode disposed below the light-emitting layer, and a second electrode disposed above the light-emitting layer, wherein an optical compensation layer is disposed above the light-emitting element layer, the optical compensation layer being configured to compensate for prevention of external light reflection at a display surface and compensate for change in color level of the display surface due to different viewing directions of the display surface.

Also, to solve the problem described above, a manufacturing method of a display device includes forming a light-emitting element layer including a light-emitting layer including a light-emitting element, a first electrode disposed below the light-emitting layer, and a second electrode disposed above the light-emitting layer, and forming an optical compensation layer disposed above the light-emitting element layer, the optical compensation layer being configured to compensate for prevention of external light reflection at a display surface and compensate for change in color level of the display surface due to different viewing directions of the display surface.

Also, to solve the problem described above, a manufacturing apparatus of a display device includes a film formation apparatus of a light-emitting element layer including a light-emitting layer including a light-emitting element, a first electrode disposed below the light-emitting layer, and a second electrode disposed above the light-emitting layer and of an optical compensation layer disposed above the light-emitting element layer, the optical compensation layer being configured to compensate for prevention of external light reflection at a display surface and compensate for change in color level of the display surface due to different viewing directions of the display surface.

Advantageous Effects of Disclosure

According to the above-described configuration, a display device can be provided that can compensate for change in color level due to different viewing directions of a display surface and that can compensate for other optical characteristics of the display surface.

DESCRIPTION OF EMBODIMENTS

First Embodiment

Figure 1:
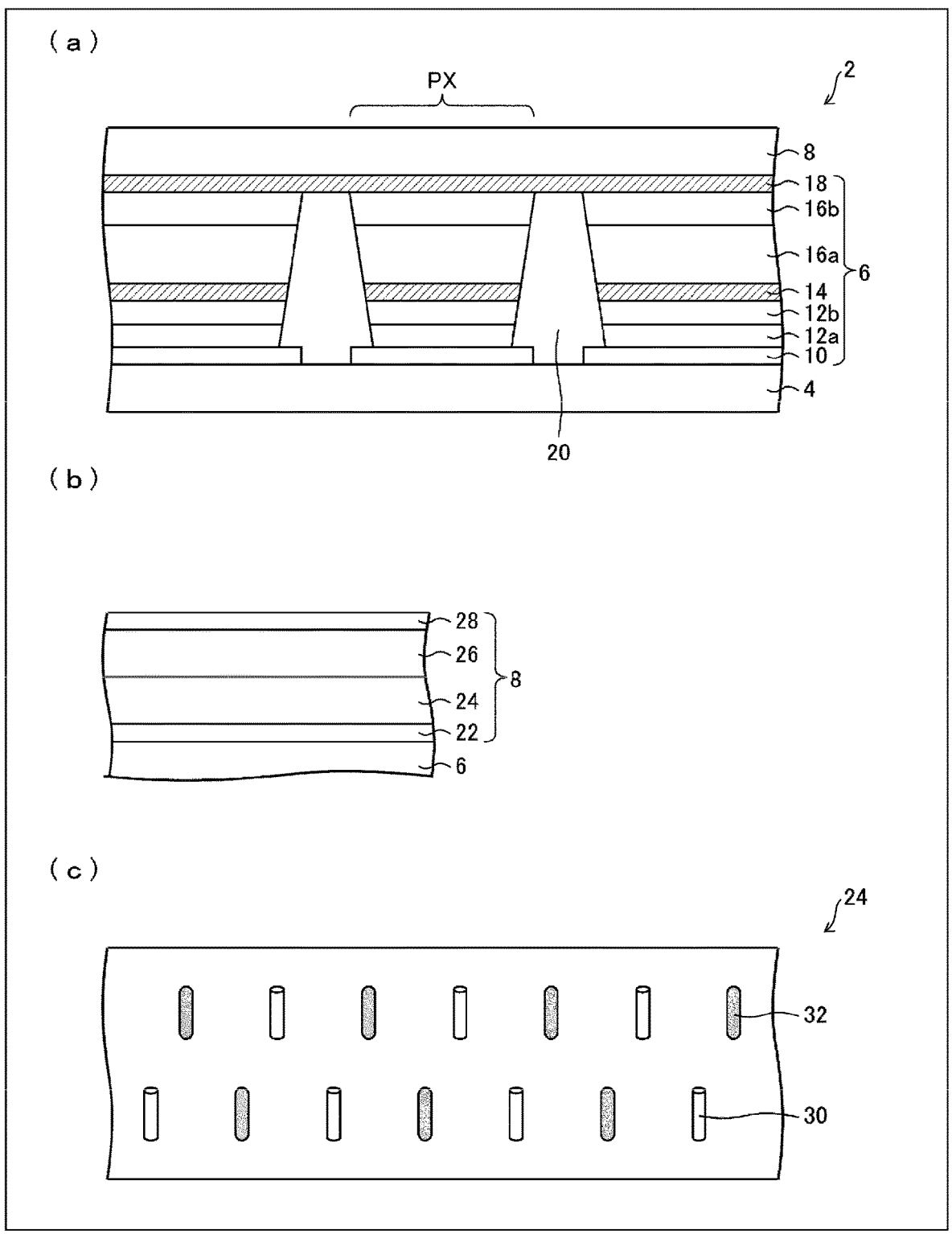
FIG. 1 is a schematic view illustrating a display device according to a first embodiment of the present disclosure.

FIG. 1 is a view illustrating a display device according to the present embodiment. (a) of FIG. 1 is a cross-sectional view of a display device 2 according to the present embodiment. (b) of FIG. 1 is a cross-sectional view illustrating in further detail an optical compensation layer 8 at one subpixel PX of the display device 2. (c) of FIG. 1 is a cross-sectional view for describing in further detail a liquid crystal layer 24 of the optical compensation layer 8. Note that in the following, the direction from a substrate 4 of the display device 2 toward the optical compensation layer 8 is defined as upward.

The display device 2 according to the present embodiment includes, in order from the lower layer, the substrate 4, a light-emitting element layer 6, and the optical compensation layer 8. The display surface of the display device 2 may be the upper face of the optical compensation layer 8. Also, a function film such as a touch panel may be adhered on the upper face of the optical compensation layer 8, and the upper face of the function film may be the display surface. Another possible configuration includes a barrier film such as a SiN barrier film disposed above a second electrode described below and a TFE film, for example, disposed above the barrier film, with the optical compensation layer 8 being disposed above the TFE film. Yet another possible configuration includes a vacuum layer disposed above the second electrode and a glass substrate disposed above the vacuum layer, with the optical compensation layer 8 being disposed above the glass substrate. The substrate 4 may include a plurality of TFTs for driving the light-emitting element layer 6 on a subpixel-by-subpixel basis.

The light-emitting element layer 6 include, in order from the lower layer, a first electrode 10 (for example, an anode), a hole injection layer 12a, a hole transport layer 12b, a light-emitting layer 14, an electron transport layer 16a, an electron injection layer 16b, and a second electrode 18 (for example, a cathode). The light-emitting element layer 6 further includes a cover film 20 that includes an opening at a location that overlaps the first electrode 10, above the first electrode 10. The openings of the cover film 20 specify the subpixels PX.

The first electrode 10 is formed in a plurality of island shapes on a subpixel PX-by-subpixel PX basis, is configured by layering Indium Tin Oxide (ITO) and an alloy including silver (Ag), for example, and has light reflectivity. The second electrode 18 is formed solid-like as a common layer for a plurality of subpixels PX and is a semipermeable electrode including a transparent conductive material, such as MgAg, Ag, yttrium (Yb), Indium Tin Oxide (ITO), Indium Zincum Oxide (IZO), and the like. In other words, some light passes through the second electrode 18 and some light is reflected.

As illustrated in (a) of FIG. 1, the island shaped first electrode 10, the hole injection layer 12a, the hole transport layer 12b, the light-emitting layer 14, the electron transport layer 16a, and the electron injection layer 16b are formed in each subpixel PX. These layers formed in island shapes together with the solid-like second electrode 18 form a plurality of light-emitting elements (for example, organic light emitting diodes (OLED)). A subpixel circuit for driving the light-emitting element described above may be provided in the light-emitting element layer 6.

In an example in which the light-emitting element layer 6 is an OLED layer, via a drive current between the first electrode 10 and the second electrode 18, positive holes are transported by the hole injection layer 12a and the hole transport layer 12b and electrons are transported by the electron transport layer 16a and the electron injection layer 16b, and the positive holes and the electrons recombine within the light-emitting layer 14. Light is emitted from the light-emitting layer 14 as a result of excitons that are generated by the recombination of positive holes and electrons falling into a ground state. Since the second electrode 18 is semipermeable and the first electrode 10 has light reflectivity, the light emitted from the light-emitting layer 14 travels upwards and results in top-emission.

The subpixels PX each include a light-emitting layer 14 that emits red, green, or blue light. Thus, when all of the subpixels PX are caused to emit light, substantially white light is emitted from the display surface. Note that the blue light is light having the central wavelength of the light emission in a wavelength band from 400 nm to 500 nm. The green light is light having the central wavelength of the light emission in a wavelength band longer than 500 nm and shorter than or equal to 600 nm. The red light is light having the central wavelength of the light emission in a wavelength band longer than 600 nm and shorter than or equal to 780 nm.

As illustrated in (b) of FIG. 1, the optical compensation layer 8 includes, in order from the lower layer, an adhesive layer 22, the liquid crystal layer 24, a retardation film 26, and a polarizer 28. The adhesive layer 22 adheres the light-emitting element layer 6 and the liquid crystal layer 24 together. The retardation film 26 is $\lambda/4$ retardation film, for example, and is adhered above the liquid crystal layer 24. The polarizer 28 is adhered above the retardation film 26.

The optical compensation layer 8 has various types of optical compensation functions to compensate for the optical characteristics of the display surface of the display device 2. For example, when external light is incident on the optical compensation layer 8 from the display surface, it can reduce the external light being reflected at the first electrode 10 of the light-emitting element layer 6, for example, and being emitted from the display surface.

When external light is incident on the optical compensation layer 8 from the display surface, the external light that passes through the polarizer 28 passes through the retardation film 26, and the polarization state changes. Also, because the light passes through the liquid crystal layer 24 twice, the polarization state is further changed. Thus, the polarization state of the light from the light-emitting layer 14 and the polarization state of the external light reflected at the first electrode 10, for example, are different. Only the light from the light-emitting layer 14 passes through the polarizer 28, with the external light not passing through the polarizer 28. This allows the external light reflected at the light-emitting element layer 6, reaching a viewer, and being observed by the viewer as unintended light to be reduced, leading to improvement in the display quality of the display device 2.

Here, in an example in which the liquid crystal layer 24 is not present, when the display device 2 is viewed from a diagonal direction, the effect of the retardation film 26 varies, and the effect of the prevention of external light reflection is reduced. To compensate for this, liquid crystals 30 of the liquid crystal layer 24 are provided (for example, see JP 2015-69158 A).

The optical compensation layer 8 is configured to compensate for the prevention of external light reflection described above and compensate for the coloration (compensation for change in color level) of the display surface when the display surface of the display device 2 is viewed from a diagonal direction.

Here, as illustrated in (c) of FIG. 1, the liquid crystal layer 24 includes the liquid crystals 30 and dichroic pigments 32. The dichroic pigments 32 have a substantially elongated shape and have the property of absorbing light with a polarization component in the direction parallel with the longitudinal direction more than light with a different polarization component. In the present embodiment, the dichroic pigments 32 are aligned, via the alignment of the liquid crystals 30, with their longitudinal direction being substantially perpendicular to the direction of the plane of the display surface. Thus, light incident at an angle substantially perpendicular to the direction of the plane of the liquid crystal layer 24 mostly passes through without being absorbed by the dichroic pigments 32. On the other hand, light incident from a diagonal direction with respect to the direction of the plane of the liquid crystal layer 24 is partly absorbed by the dichroic pigments 32. The wavelength of light absorbed by the dichroic pigments 32 is determined by the structure of the dichroic pigments 32.

Thus, when the display surface of the display device 2 of the present embodiment is viewed from a direction directly opposite the display surface, the light from the light-emitting layer 14 is not absorbed by the dichroic pigments 32 and reaches the viewer. On the other hand, when the display surface of the display device 2 is viewed from a diagonal direction with respect to the display surface, the light from the light-emitting layer 14 is partly absorbed by the dichroic pigments 32 and reaches the viewer.

In the optical compensation layer 8 of the present embodiment, the liquid crystal layer 24 including the dichroic pigments 32 is applied to the retardation film 26 (application target) and formed on the retardation film 26, for example.

In the optical compensation layer 8 of the present embodiment, a plurality of types, for example two types, of dichroic pigments 32 that absorb light of different wavelengths are used (details are described below). Also, liquid crystal molecules with high vertical alignment such as smectic B phase liquid crystal molecules are preferably used as the liquid crystals 30. By using liquid crystal molecules with high vertical alignment, the dichroic pigments 32 can be easily aligned substantially vertically. Thus, even in the case where the optical compensation layer 8 includes a small added amount of the dichroic pigments 32, a significant effect can be easily obtained.

Also, in the optical compensation layer 8 of the present embodiment, the film thickness and the like of the liquid crystal layer 24 including the dichroic pigments 32 is appropriately set so that prevention of external light reflection and coloration related to the optical compensation layer 8 described above can both be appropriately compensated for.

Figure 2:
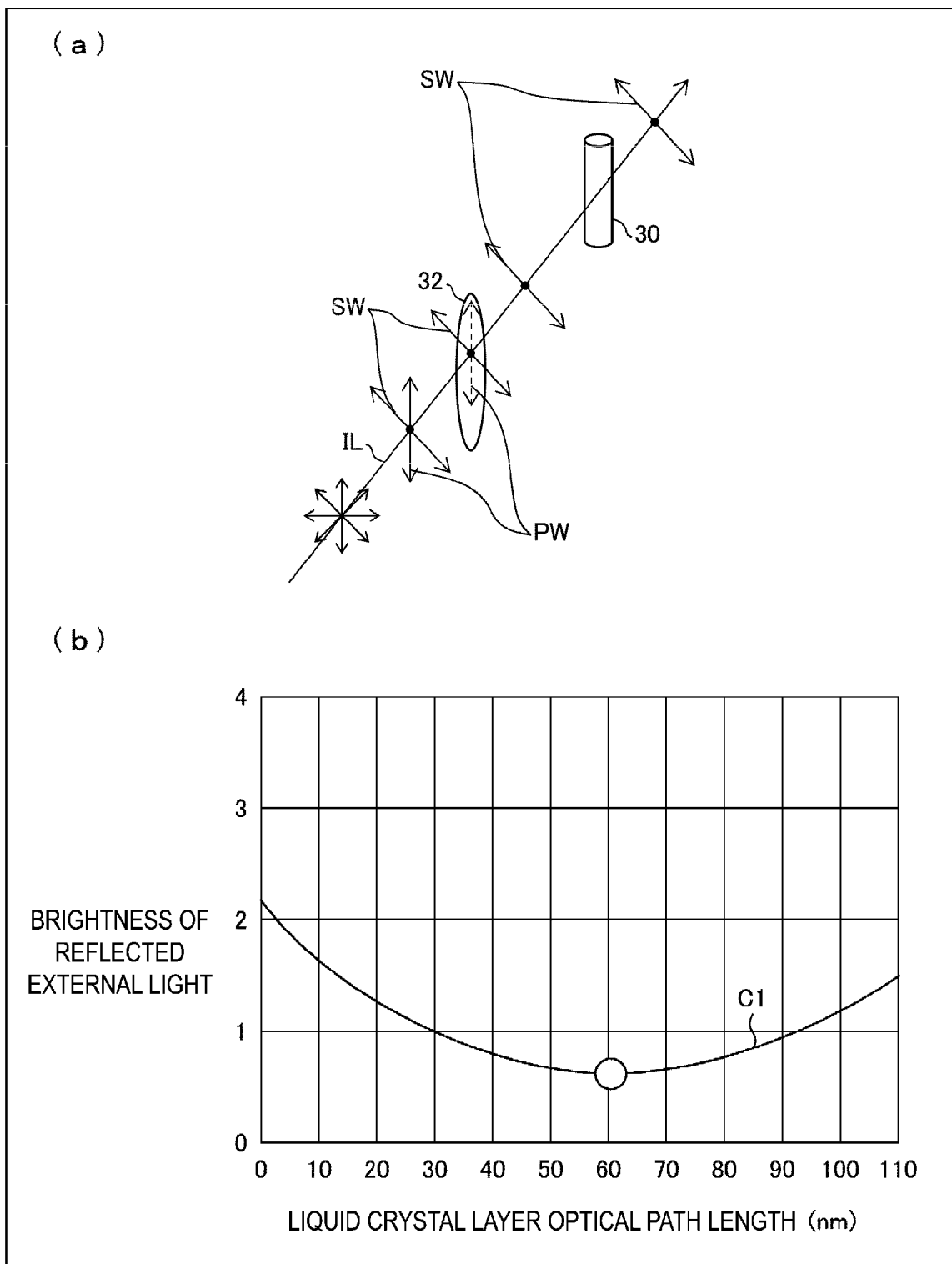
FIG. 2 is a diagram for describing optimizing the design of a liquid crystal layer according to the first embodiment of the present disclosure.

Next, how to optimize the design of the liquid crystal layer 24 will be described with reference to FIG. 2. (a) of FIG. 2 is a view for describing the behavior of an incident light IL when the incident light IL is incident on the liquid crystal layer 24. As illustrated in (a) of FIG. 2, in an example in which the liquid crystal layer 24 includes the dichroic pigments 32, the incident light IL of the light emitted from the light-emitting element layer 6 that is incident on the liquid crystal layer 24 includes a P wave PW component that is completely absorbed by the dichroic pigment 32, leaving an S wave SW component, among the components of the incident light IL. In the liquid crystal layer 24, the liquid crystal 30 does not react to the S wave SW.

In other words, in an example in which the liquid crystal layer 24 includes the dichroic pigments 32, compensation, via the liquid crystals 30 in the liquid crystal layer 24, for a reduction in the effect of preventing reflection of external light is not performed. Thus, adding the dichroic pigments 32 to the liquid crystal layer 24 is not typical in a configuration including the retardation film 26 and the polarizer 28.

However, as a result of diligent research, the inventors of the present disclosure discovered a condition for achieving both compensation for the prevention of external light reflection and compensation for coloration by appropriately setting the added amount of the dichroic pigments 32 and compensation conditions for the liquid crystal layer 24.

Here, according to the results from simulations and the like run by the inventors of the present disclosure, the condition for the added amount of the dichroic pigments 32 in the liquid crystal layer 24 was found to be 10 wt. % or less and more preferably 1 wt. % or less.

Also, d·Δn (product of a refractive index anisotropy Δn of the liquid crystals 30 and a film thickness d of the liquid crystal layer 24) of the liquid crystal layer 24 was demonstrated to be 60 nm 40 nm (i.e., a range from 20 nm to 100 nm) and desirably 60 nm±10 nm (i.e., a range from 50 nm to 70 nm). An example of calculation results for d·Δn of the liquid crystal layer 24 arrived at by the inventors of the present disclosure is illustrated in (b) of FIG. 2. In (b) of FIG. 2, the horizontal axis is d·Δn of the liquid crystal layer 24, and the vertical axis is the average value of brightness in a 360 degree azimuth. Also, the calculation results illustrated in (b) of FIG. 2 are an example of calculation results from a case in which the angle formed by the vertical direction and the viewing direction with respect to the display surface is 60°, for example.

In (b) of FIG. 2, as illustrated by a curved line C1, the average value of brightness of external light seen by the viewer is the minimum value when d·Δn of the liquid crystal layer 24 is 60 nm. In other words, the optimal value of d·Δn of the liquid crystal layer 24 is 60 nm. By setting the value of d·Δn of the liquid crystal layer 24 to a range of 60 nm 10 nm, when the viewer views the display surface from a diagonal direction, excellent properties (compensation for prevention of external light reflection and compensation for coloration) were demonstrated to be able to be achieved.

Next, with reference to FIG. 3, a cavity structure of the display device 2 according to the present embodiment and coloration due to different viewing directions will be described. (a) of FIG. 3 is an enlarged cross-sectional view of the light-emitting element layer 6 at one of the subpixels PX.

Light from the light-emitting layer 14 travels toward the first electrode 10 and the second electrode 18. Light traveling in the direction of the first electrode 10 is reflected in the direction of the arrow illustrated in (a) of FIG. 3 at the first electrode 10 with light reflectivity and travels toward the second electrode 18. Light traveling in the direction of the second electrode 18 is partly reflected in the direction of the arrow illustrated in (a) of FIG. 3 at the second electrode 18 which is semitransparent. The non-reflected light passes through the second electrode 18 and is emitted from the display surface.

Thus, by the light from the light-emitting layer 14 repeatedly being reflected between the first electrode 10 and the second electrode 18, light with a wavelength corresponding to the distance between the first electrode 10 and the second electrode 18 resonates and is stimulated emitted. Thus, the half width of the spectrum of the light emitted from the subpixel PX is reduced, resulting in light with a deep color level being emitted. In this manner, the light-emitting element layer 6 of the display device 2 of the present embodiment has a cavity structure between the first electrode 10 and the second electrode 18.

Figure 3:
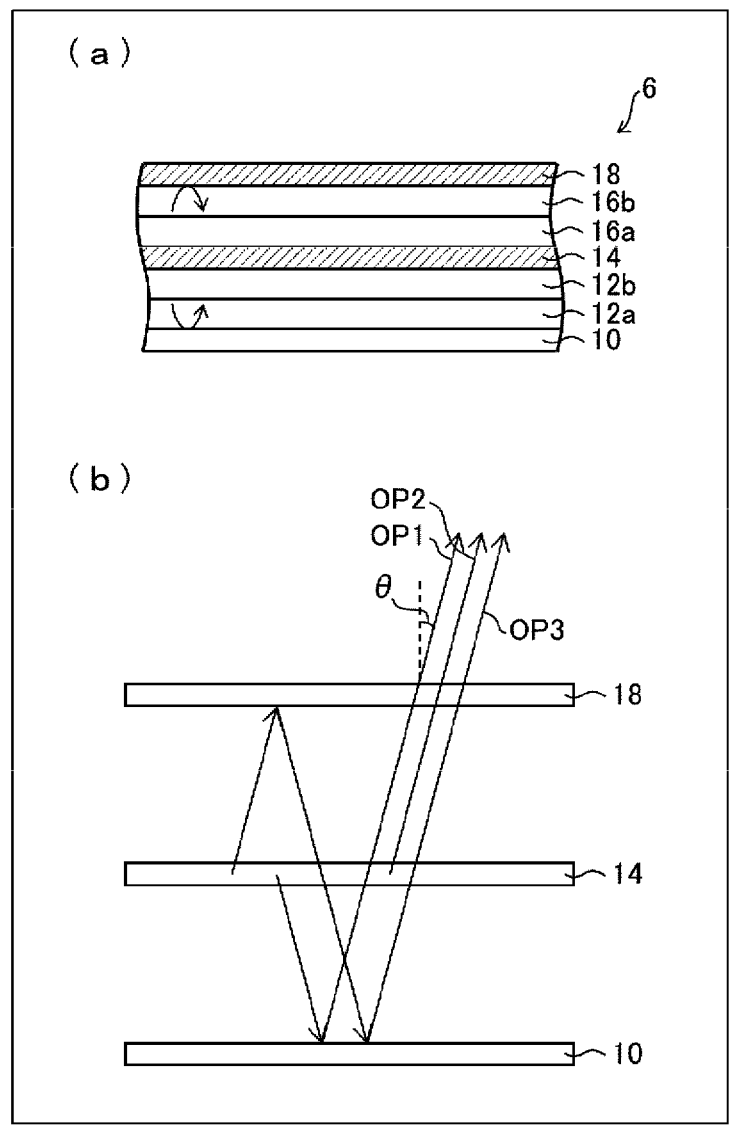
FIG. 3 is a diagram for describing a cavity structure of a display device according to the first embodiment of the present disclosure and the principle behind the change in color level of the display surface.

(b) of FIG. 3 is a view for describing the relationship between the wavelength of light that resonates via the cavity structure described above and the viewing direction of the light with respect to the display surface. In (b) of FIG. 3, for the purpose of simplification, the components other than the first electrode 10, the light-emitting layer 14, and the second electrode 18 are omitted.

In (b) of FIG. 3, optical paths including optical path OP1, optical path OP2, and optical path OP3 of the light emitted from the light-emitting layer 14 are illustrated. Optical path OP1 is the optical path of the light emitted from the light-emitting layer 14 that is reflected at the first electrode 10 and then travels toward the display surface. Optical path OP2 is the optical path of the light emitted from the light-emitting layer 14 that is not reflected at the first electrode 10 and travels toward the display surface. Optical path OP3 is the optical path of the light emitted from the light-emitting layer 14 that is reflected at the second electrode 18 and then the first electrode 10 and then travels toward the display surface.

The difference in optical distance between the optical path OP1 and the optical path OP2 is defined as L1, and the difference in optical distance between the optical path OP2 and the optical path OP3 is defined as L2. Here, an optical distance L of a layer is represented by $$L = \Sigma d_i \cdot n_i \cdot \cos \theta_i \quad \text{(Equation 1)}.$$

In Equation 1, $\theta_i$ is the angle of the transmitted light of the i-th transparent layer, $d_i$ is the thickness of the i-th transparent layer, and $n_i$ is the refractive index of the i-th transparent layer.

The wavelength of light from the light-emitting layer 14 is $\lambda$, and m is an integer of 0 or greater. The condition of constructive interference for light traveling on the optical path OP1 and the optical path OP2, taking into account reflection phase change at the first electrode, is represented by $$L1 = ((2m+1)/4)\lambda \quad \text{(Equation 2)}.$$

Also, the condition of constructive interference for light traveling on the optical path OP1 and the optical path OP2, taking into account reflection phase change at the first electrode, is represented by $$L2 = ((m+1)/2)k \quad \text{(Equation 3)}.$$

When the exit angle of the light at the display surface is 0, the angle $\theta$ is proportional to the reflection angle and the exit angle of each layer. Thus, the relationship between Equation 1, Equation 2, and Equation 3 shows that the wavelength of the resonant light is proportional to $\cos \theta$. Thus, as $\theta$ increases from 0° to 90°, the wavelength of the resonant light becomes shorter.

When the configuration described above is applied to the display device 2 according to the present embodiment, it can be seen that when the viewing angle of the display surface is changed to a viewing angle that is a diagonal direction with respect to a direction directly opposite the display surface, the resonant wavelength produced by the cavity structure of the light-emitting element layer 6 is shortened. Accordingly, in an example where the display device has the cavity structure described above and the display surface is viewed from a diagonal direction, the coloration of the display surface is problematic compared to an example where the display surface is viewed from a direction directly opposite.

The display device 2 according to the present embodiment includes the dichroic pigments 32 aligned in the optical compensation layer 8 with their longitudinal direction perpendicular to the display surface. By disposing the dichroic pigments 32 with an appropriate design in response to the coloration described above produced as a result of viewing the display surface from a diagonal direction, the coloration can be compensated for.

Thus, by the display device 2 according to the present embodiment including the dichroic pigments 32 described above to compensate for the coloration described above, the light emitted from the light-emitting layer 14 can be adjusted to colors, such as purple, blue, and red. Next, how the optical compensation layer 8 of the present embodiment compensates for the coloration described above is described in detail with reference to FIGS. 4 to 6.

Figure 4:
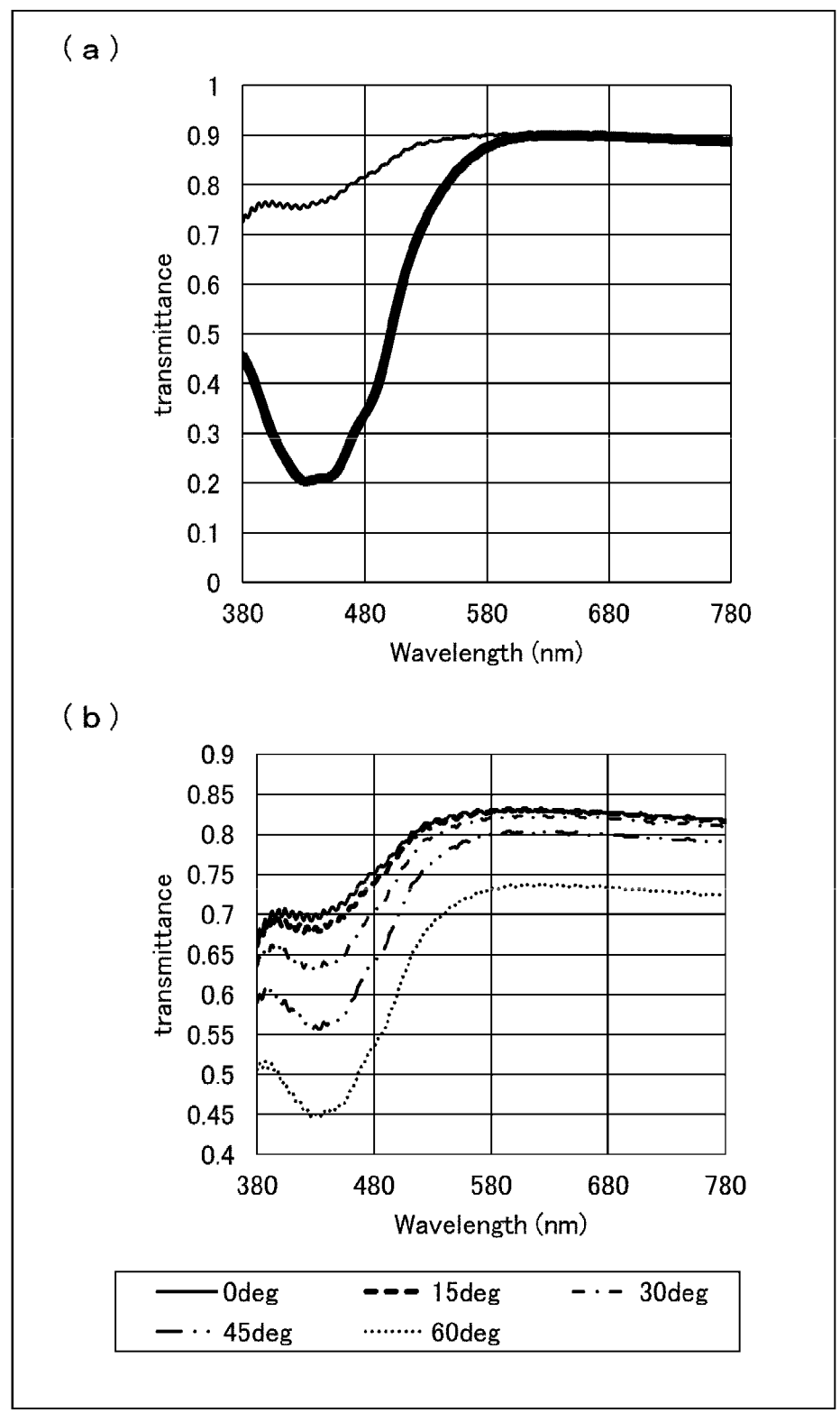
FIG. 4 is a diagram for describing the optical characteristics of one dichroic pigment of the display device according to the first embodiment of the present disclosure.
Figure 5:
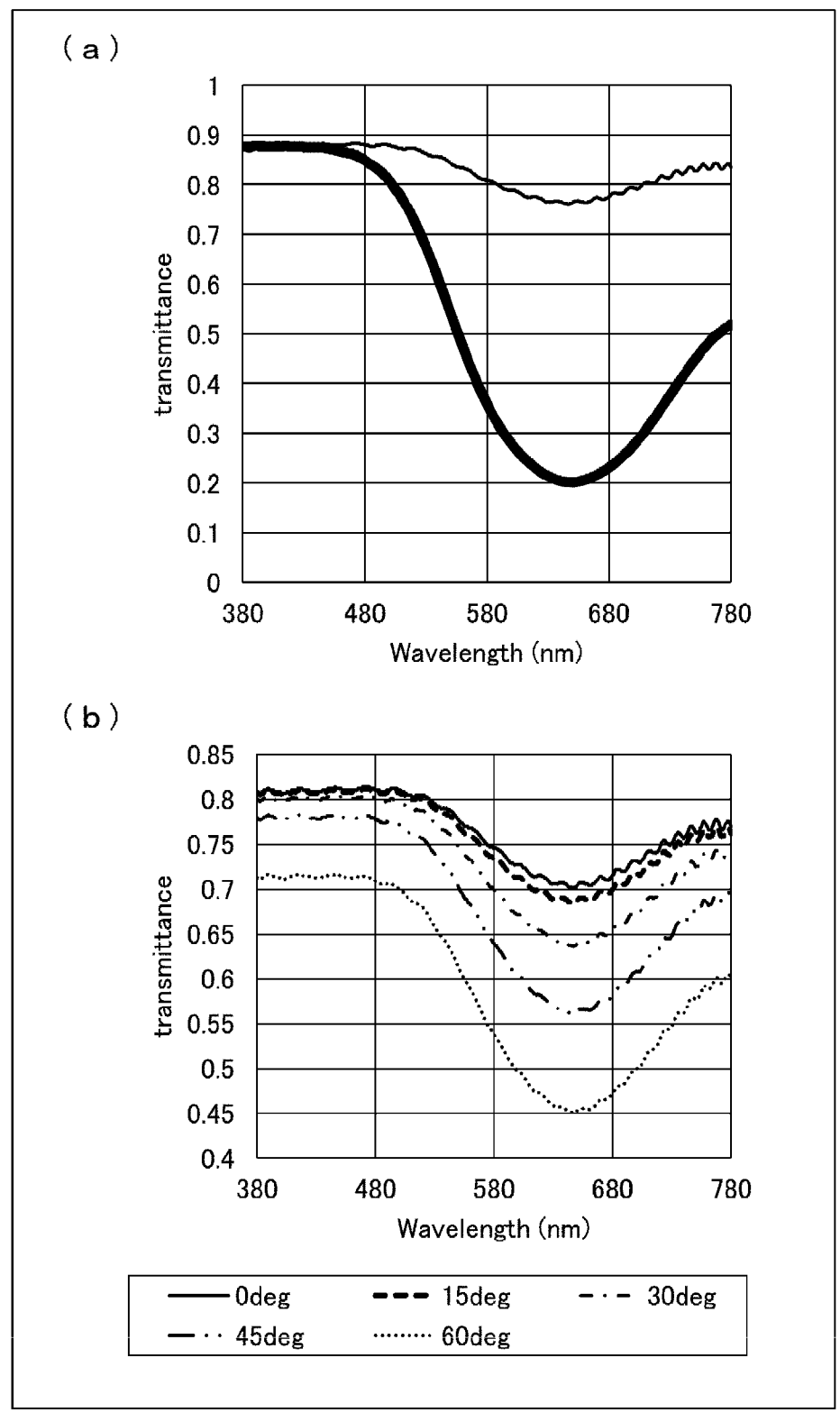
FIG. 5 is a diagram for describing the optical characteristics of another dichroic pigment of the display device according to the first embodiment of the present disclosure.

FIGS. 4 and 5 are views illustrating examples of optical characteristics of the dichroic pigments 32 of the optical compensation layer 8 according to the present embodiment. FIG. 4 illustrates the optical characteristics of yellow dichroic pigments 32 that absorb mainly blue light. FIG. 5 illustrates the optical characteristics of blue dichroic pigments 32 that absorb mainly from green to red light.

(a) and (b) of FIGS. 4 and 5 are graphs illustrating the transmittance of light through a physical body including the dichroic pigments 32 per wavelength of light. In (a) of FIGS. 4 and 5, the thick line indicates the transmittance of light when the polarized light is parallel with the longitudinal direction of the dichroic pigments 32 and the thin line indicates the transmittance of light when the polarized light is perpendicular to the longitudinal direction of the dichroic pigments 32. Also, in (b) of FIGS. 4 and 5, the transmittance of light for each angle formed by the travel direction of the light and the longitudinal direction of the dichroic pigments 32 is indicated.

For the dichroic pigments 32 illustrated in FIG. 4, when the polarized light is parallel with the longitudinal direction of the dichroic pigments 32 as illustrated in (a) of FIG. 4, light of wavelengths from approximately 380 to 500 nm are absorbed. When the polarized light is perpendicular to the longitudinal direction of the dichroic pigments 32, light of any wavelength is significantly not absorbed. Also, as illustrated in (b) of FIG. 4, the light of wavelengths from approximately 380 to 500 nm has a higher absorption rate at higher angles formed between the travel direction of the light and the longitudinal direction of the dichroic pigments 32. However, light with wavelengths outside this range is not significantly absorbed.

For the dichroic pigments 32 illustrated in FIG. 5, when the polarized light is parallel with the longitudinal direction of the dichroic pigments 32 as illustrated in (a) of FIG. 5, light of wavelengths from approximately 480 to 780 nm are absorbed. When the polarized light is perpendicular to the longitudinal direction of the dichroic pigments 32, light of any wavelength is significantly not absorbed. Also, as illustrated in (b) of FIG. 5, the light of wavelengths from approximately 480 to 780 nm has a higher absorption rate at higher angles formed between the travel direction of the light and the longitudinal direction of the dichroic pigments 32. However, light with wavelengths outside this range is not significantly absorbed.

Figure 6:
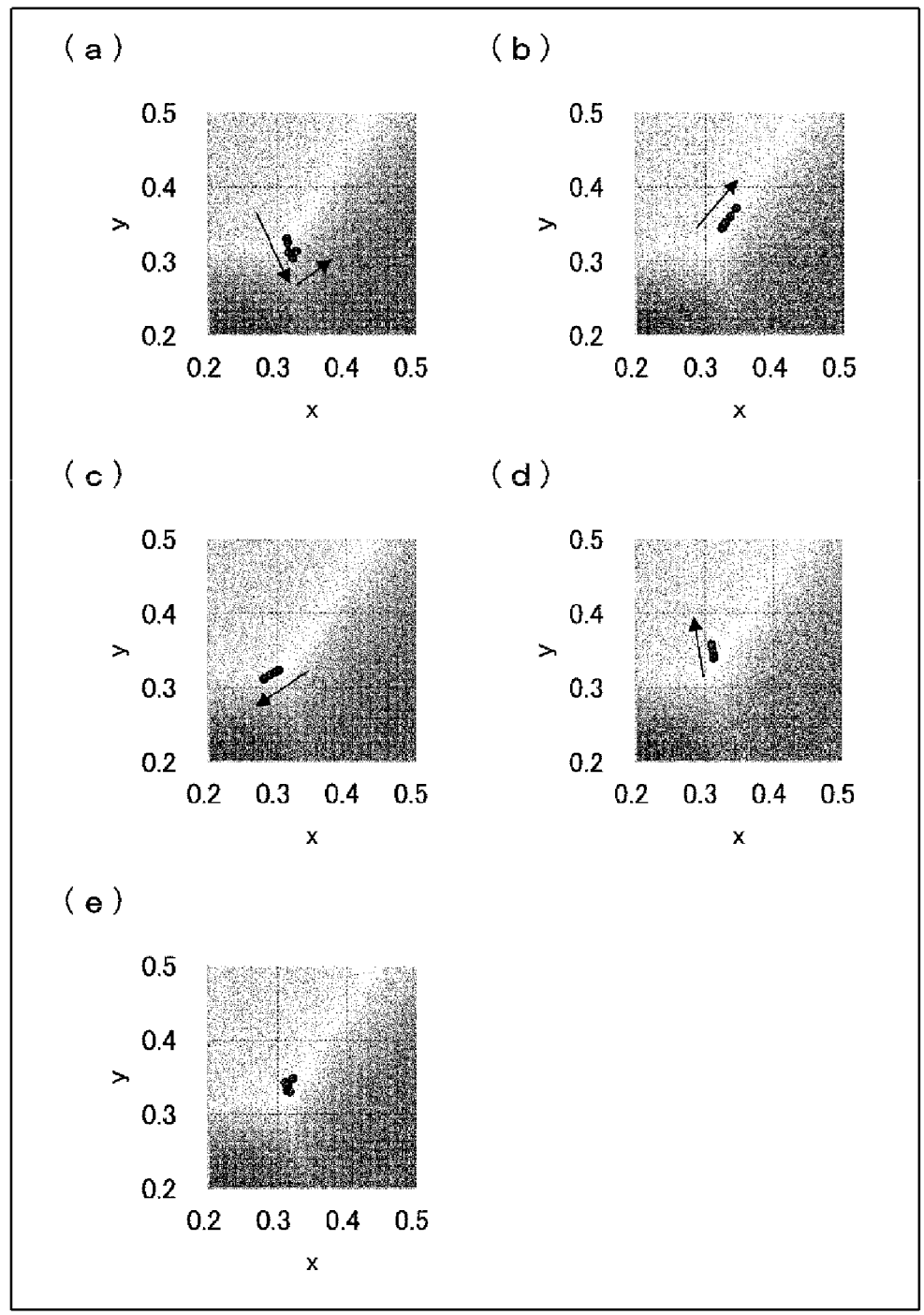
FIG. 6 is an x-y chromaticity coordinate diagram for describing compensation for the change in color level of the display device according to the first embodiment of the present disclosure.

FIG. 6 is an x-y chromaticity coordinate diagram for specifically describing the compensation for change in color level due to different viewing directions of the display surface in the display device 2 including the dichroic pigments 32 described above.

(a) of FIG. 6 is a chromaticity diagram illustrating the color level of the display surface of the display device displaying white light, the display device not including dichroic pigments 32, for each angle formed by the vertical direction and the viewing direction with respect to the display surface. When the angle formed between the vertical direction and the viewing direction with respect to the display surface changes from 0°, 15°, 30°, 45°, and 60°, the color level of the display surface changes from the white position in the direction of the arrows in (a) of FIG. 6. Thus, when viewing the display surface from the diagonal direction, the coloration of the display surface occurs.

(b) and (c) of FIG. 6 each are chromaticity diagrams illustrating the color level of light passing through the dichroic pigments 32 in a case where white light is projected at the dichroic pigments 32 with the optical characteristics illustrated in FIGS. 4 and 5 for each angle formed by the longitudinal direction of the dichroic pigments 32 and the viewing direction. (d) of FIG. 6 illustrates the color level of the transmitted light of white light projected at the liquid crystal layer 24 including the dichroic pigments 32 with the optical characteristics illustrated in both FIGS. 4 and 5. When the angle formed between the longitudinal direction of the dichroic pigments 32 and the viewing direction changes from 0°, 15°, 30°, 45°, and 60°, the color level of the light passed through the dichroic pigments 32 changes from the white position in the direction of the arrows in (b) to (d) of FIG. 6.

(e) of FIG. 6 is a chromaticity diagram illustrating the color level of the display surface of the display device 2 displaying white light, the display device 2 including the dichroic pigments 32 with the optical characteristics illustrated in both FIGS. 4 and 5, for each angle formed by the vertical direction and the viewing direction with respect to the display surface. As can be seen from (e) of FIG. 6, the change in color level due to different viewing angles is less than that illustrated in (a) of FIG. 6. This is because the change in the color level illustrated in (a) of FIG. 6 and the change in the color level illustrated in (d) of FIG. 6 are at substantially symmetrical positions with reference to the white position and canceled out one another. Thus, the display device 2 including the dichroic pigments 32 with the optical characteristics illustrated in both FIGS. 4 and 5 can reduce the change in color level of the display surface due to different viewing directions. That is, the dichroic pigments 32 described above can compensate for the dependence on the viewing angle of the luminescent color of the light emitted from the light-emitting element layer.

Next, a method for determining the added amount (10 wt. % or less, preferably 1 wt. % of less) of the dichroic pigments 32 in the liquid crystal layer 24 will be described in detail with reference to FIG. 7. Note that in the description below, the added amount for an example where the dichroic pigments 32 with the optical characteristics illustrated in both FIGS. 4 and 5 are included is described. In this example, the chromaticity coordinates when light is emitted using the display device 2 without the optical compensation layer 8 and including only the light-emitting element layer 6 is as illustrated in (a) of FIG. 7.

Figure 7:
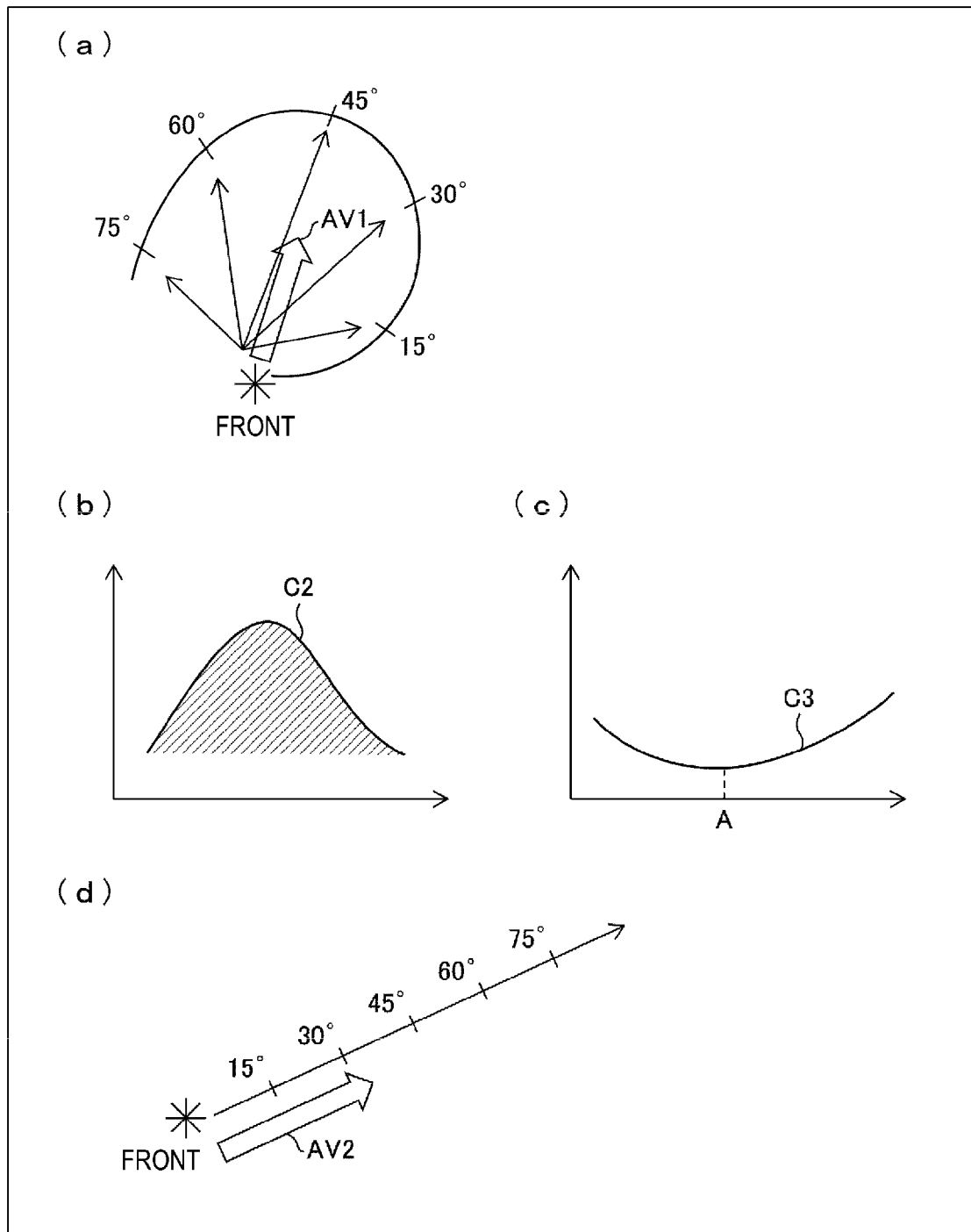
FIG. 7 is a diagram for describing a method of determining the added amount of the dichroic pigment in the liquid crystal layer according to the first embodiment of the present disclosure.

(a) of FIG. 7 illustrates the x-y chromaticity coordinates of the color level of light emitted from the light-emitting element layer 6 of the display device 2 for each angle formed by the vertical direction and the viewing direction with respect to the display surface. As illustrated in (a) of FIG. 7, the color level of the light emitted from the light-emitting element layer 6 changes in x-y coordinates in a counter-clockwise direction as the angle of the viewing direction described above changes from 0° to 75°. Also, the light emitted from the light-emitting element layer 6 changes its color level from the color level in the vertical direction with respect to the display surface (i.e., an angle of 0°) to the color levels in each angle described above as illustrated by the corresponding arrows. Furthermore, the average change in color level of light emitted from the light-emitting element layer 6 when viewing the display surface from all angles described above is substantially identical to the change in color level when viewed at an angle of 45°, as illustrated by arrow AV1 in (a) of FIG. 7.

In this way, for the display device 2 in which the color level changes depending on the angle of the viewing direction, the added amount of the dichroic pigments 32 in the liquid crystal layer 24 is determined by adopting the average value of change in color level as the value of change in color level (the coloration described above) of the display device 2. Also, the value of change in color level at an angle of viewing direction from 30° to 60° may be adopted as the value of change in color level (the coloration described above) of the display device 2.

Specifically, as illustrated in (b) of FIG. 7, A curved line C2 is plotted on a graph in which the horizontal axis is the angle of the viewing direction with respect to the vertical direction of the display surface and the vertical axis is an absolute value of the magnitude of change in color level corresponding to the angle. Later, the average integration value of the shaded portion in (b) of FIG. 7 is calculated.

Furthermore, the curved line C3 in (c) of FIG. 7 is obtained, the curved line C3 indicating the relationship between the calculated average integration value and the color level of the light emitted from the optical compensation layer 8 when the added amount of the dichroic pigments 32 in the liquid crystal layer 24 is changed. In (c) of FIG. 7, the vertical axis is the integration value of the shaded portion of curved line C2 and the horizontal axis is the added amount of the dichroic pigments 32 in the liquid crystal layer 24. Then, as illustrated in (c) of FIG. 7, an added amount A, which is the minimum value of the curved line C3 is taken as the added amount of the dichroic pigments 32.

In this way, in the display device 2 of the present embodiment, by adopting the minimum value of the curved line C3 as the added amount A, the change in color level of the display surface due to different viewing directions can be reduced. In other words, in the display device 2 of the present embodiment, the added amount of the dichroic pigments 32 in the liquid crystal layer 24 is determined such that the arrow AV1 indicating the average change in color level illustrated in (a) of FIG. 7 is substantially equal to the magnitude of change in color level in the opposite direction. In this way, the display device 2 can reduce the change in color level of the display surface due to different viewing directions of the display surface.

Note that, as illustrated in (d) of FIG. 7, depending on the configuration of the display device 2, the angle described above may change to a straight line in x-y chromaticity coordinates as the angle formed by the vertical direction and the viewing direction with respect to the display surface changes from 0° to 75°. In this example, the average change in color level is indicated by arrow AV2 (average) in (d) of FIG. 7. In such a case, similar to the example of (a) of FIG. 7, the curved line C2 of (b) of FIG. 7 is made, then the curved line C3 of (c) of FIG. 7 is determined, with the added amount A, which is the minimum value of the curved line C3, determined to be the added amount of the dichroic pigments 32.

As described above, in the display device 2 according to the present embodiment, as the method of adjusting the luminescent color (color of illumination), first, on the basis of the cavity structure, the change direction in chromaticity coordinates of coloration at diagonal viewing angles is determined. Next, the dichroic pigment 32 that compensates for the change in coloration (change in color level) is determined, and the added amount of the dichroic pigments 32 and the d·Δn of the liquid crystal layer 24 are optimized. Finally, by adjusting the color of the white seen from the front and optimizing the gray scale assignment for each color of RGB, the luminescent color can be controlled.

The display device 2 according to the present embodiment reduces the change in color level (coloration) of the display surface due to different viewing directions while performing optical compensation for reflected light at the display surface. Thus, the display device 2 can enhance the display quality and mitigate the coloration of the display surface in a compatible manner. The optical compensation layer 8 includes the liquid crystal layer 24, the retardation film 26, and the polarizer 28. This allows it to effectively reduce external light reflection at the light-emitting element layer 6.

In the present embodiment, the optical compensation layer 8 is formed as a component common to the plurality of subpixels PX. Thus, by forming the optical compensation layer 8 and bonding the optical compensation layer 8 on the light-emitting element layer 6 with the adhesive layer 22 therebetween, the configuration of the display device 2 can be made simple.

In the present embodiment, the optical compensation layer 8 includes the liquid crystal layer 24 with the dichroic pigments 32. Thus, by utilizing the orientation of the liquid crystals 30 of the liquid crystal layer 24 used for optical compensation, the dichroic pigments 32 can be appropriately aligned. This removes the need to prepare a separate layer for aligning the dichroic pigments 32. Furthermore, by providing the optical compensation layer 8 with a plurality of types of the dichroic pigments 32 as in the display device 2 of the present embodiment, appropriate compensation for the change in color level of the display surface can be easily achieved.

Second Embodiment

The display device 2 according to the present embodiment may have the same configuration as the display device 2 according to the previous embodiment illustrated in FIG. 1. The display device 2 of the present embodiment is only different from the display device 2 of the previous embodiment in that the wavelength of the resonate light produced by the cavity structure of the light-emitting element layer 6 is different.

Figure 8:
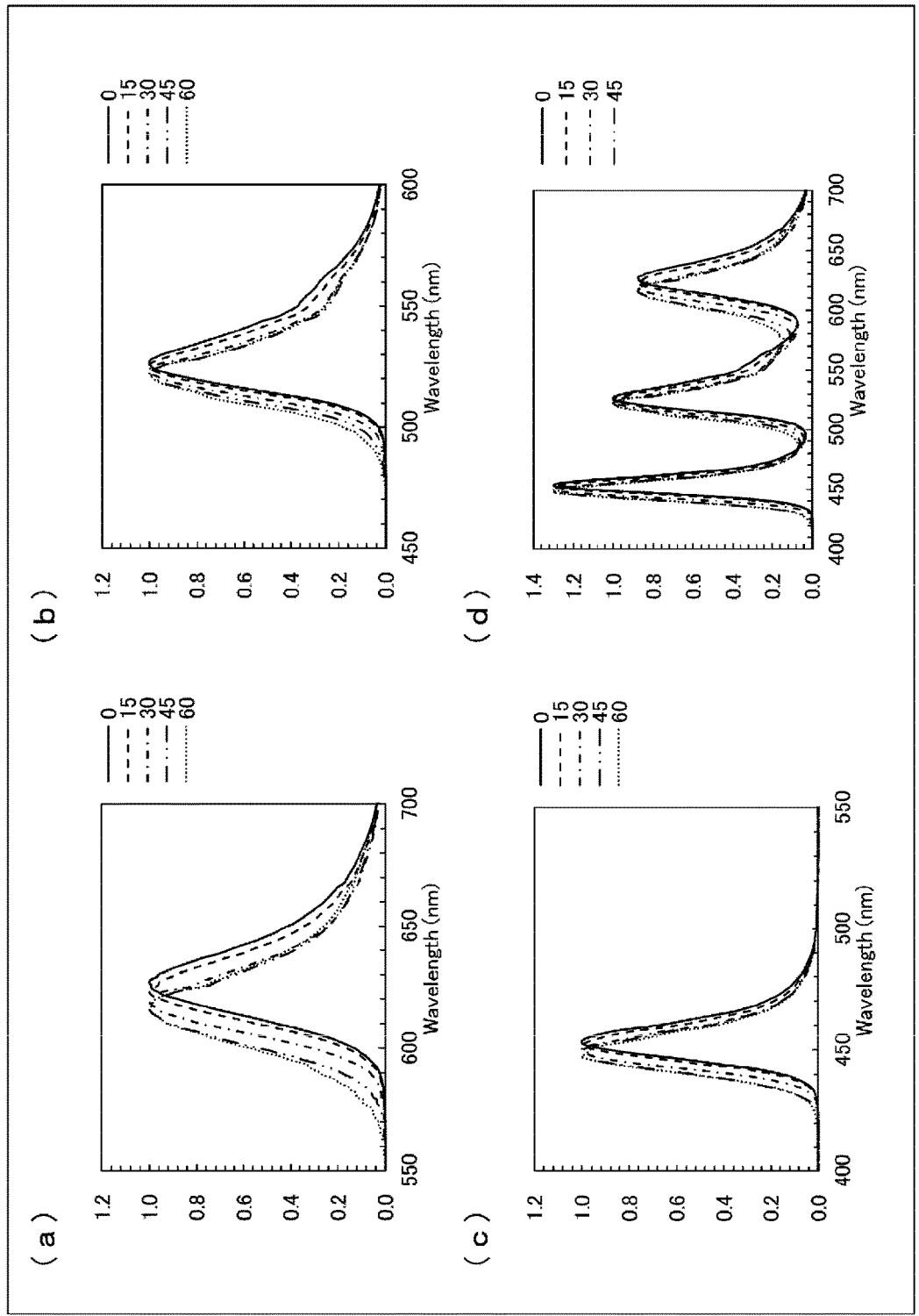
FIG. 8 is a spectrum diagram illustrating the change in light emission spectrum of a light-emitting layer due to different viewing directions of the display surface of the display device according to the first embodiment of the present disclosure.

FIG. 8 is a diagram illustrating the light emission spectrum of light from the subpixels PX of the display device 2 according to the previous embodiment. (a) to (c) of FIG. 8 illustrate the light emission spectrum of light from the subpixels PX corresponding to red, green, and blue. (d) of FIG. 8 illustrates the light emission spectrum of light containing the light from all of the subpixels PX, i.e., the light emission spectrum of light from the display surface when the display device 2 displays white light. In the spectrum diagrams of FIG. 8, the horizontal axis is the wavelength and the vertical axis is the light emission intensity.

The spectrum diagrams of FIG. 8 illustrate light emission spectra when the angle formed between the vertical direction and the viewing direction with respect to the display surface changes from 0°, 15°, 30°, 45°, and 60°. Note that the intensity at each angle is normalized.

In the diagrams, the wavelength of the light with the maximum value in the light emission spectrum changes in the smaller direction. This is due to the reduced wavelength of the resonated light produced by the cavity structure. Because of this, when the resonant wavelength produced by the cavity structure is set to match the wavelength at which the intensity is maximum when the angle formed by the vertical direction and the viewing direction of the display surface is 0°, the display luminance is greatly reduced when viewing the display surface from a diagonal direction.

Furthermore, when the display surface is viewed from a diagonal direction, the light emitted from the light-emitting layer 14 by the dichroic pigments 32 described above is partly absorbed. Thus, when viewing the display surface from the diagonal direction, the brightness is reduced compared to when viewing the display surface from a direction directly opposite.

Figure 9:
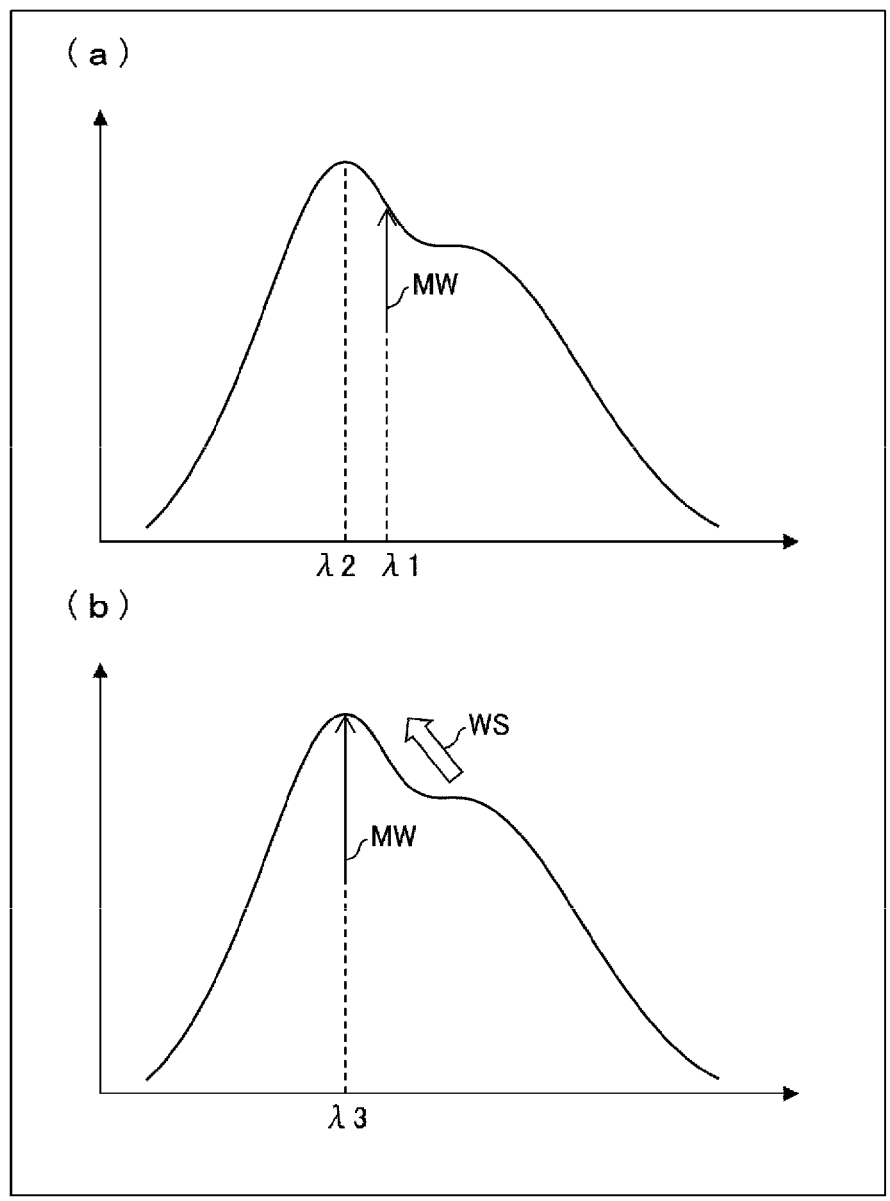
FIG. 9 is a diagram illustrating the relationship between a resonant wavelength produced by the cavity structure of the display device according to a second embodiment of the present disclosure and change in light emission intensity due to compensation for change in color level.

FIG. 9 is a diagram illustrating the relationship between the resonant wavelength produced by the cavity structure and the intensity of light with this wavelength for the display device 2 according to the present embodiment. FIG. 9 illustrates spectrum diagrams of light emitted from the light-emitting layer 14 at one of the subpixels PX of the display device 2. The horizontal axis is the wavelength, and the vertical axis is the intensity.

In FIG. 9, the resonant light produced by the cavity structure at each subpixel PX at a certain viewing angle of light traveling at each of the viewing angles from the display surface is indicated by an arrow MW. In the present embodiment, as illustrated in (a) of FIG. 9, when the display surface is viewed from a position directly opposite, the arrow MW corresponds to light with a wavelength λ1. That is, in the optical path that travels in a direction perpendicular with respect to the display surface, the resonant wavelength produced by the cavity structure described above matches the wavelength λ1. Light with the wavelength λ1 of the light emitted from the light-emitting layer 14 is set to be on the longer wavelength side of a wavelength λ2 with maximum intensity.

Thus, when the display surface is viewed from a diagonal direction, the arrow MW shifts to the shorter wavelength side in the direction of an arrow WS illustrated in (b) of FIG. 9 to a position corresponding to light with a wavelength λ3. The wavelength λ3 may substantially match the wavelength λ2 described above. Thus, when viewing the display surface from the diagonal direction, the intensity of the light emitted from the display surface is increased.

That is, in the present embodiment, the light viewed from a diagonal direction with respect to the display surface is partly absorbed by the dichroic pigments 32. Thus, the intensity is reduced. However, the light-emitting element layer 6 and the optical compensation layer 8 can be designed so that the increase in intensity due to the change in wavelength of the resonant light produced by the cavity structure and the decrease in intensity due to absorption by the dichroic pigments 32 cancel out one another. Thus, with the display device according to the present embodiment, the change in color level due to different viewing directions of the display surface can be compensated for without the occurrence of change in brightness due to different viewing directions of the display surface.

Figure 10:
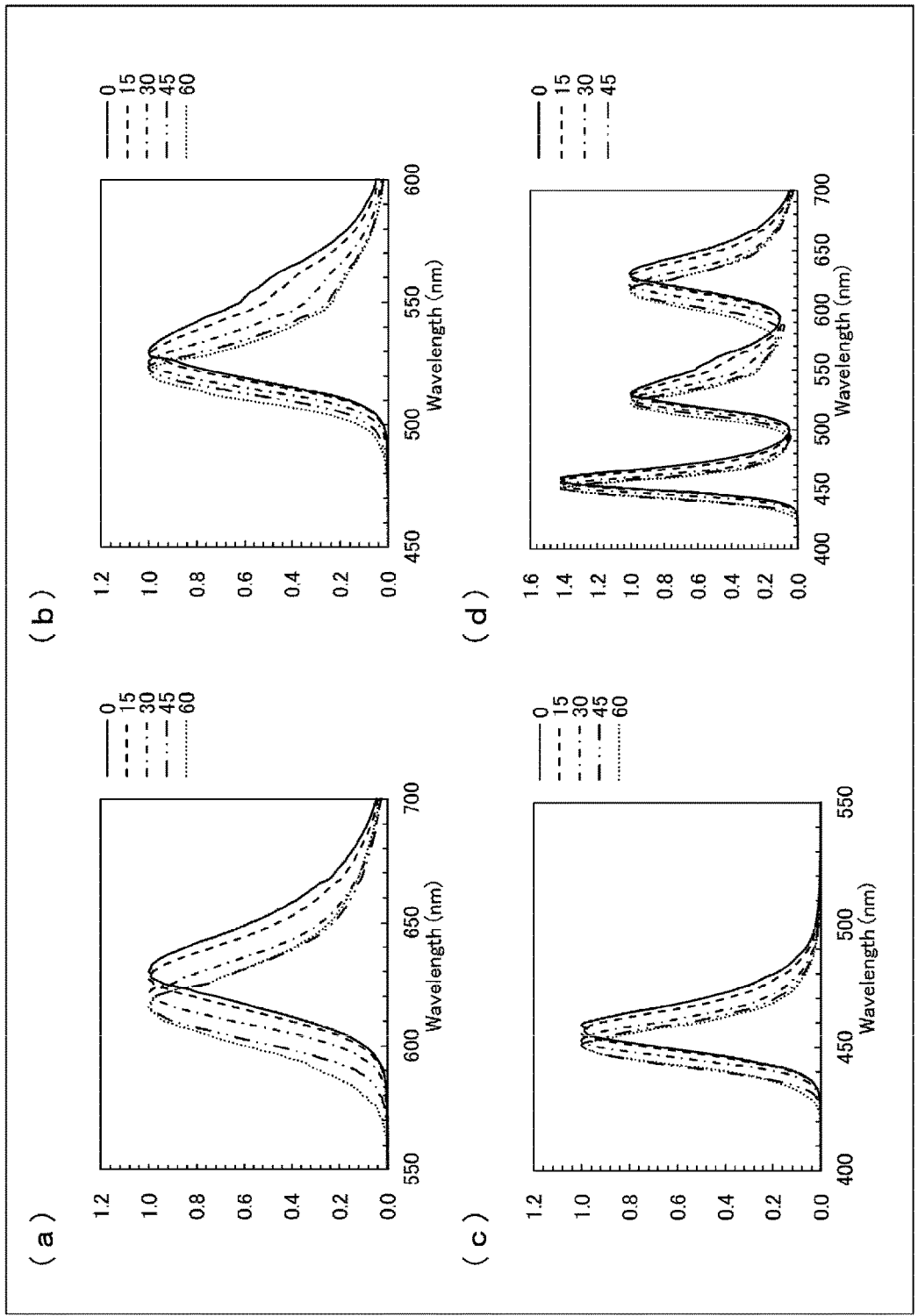
FIG. 10 is a spectrum diagram illustrating the change in light emission spectrum of the light-emitting layer due to different viewing directions of the display surface of the display device according to the second embodiment of the present disclosure.

FIG. 10 illustrates spectrum diagrams of the display device 2 according to the present embodiment corresponding to FIG. 8. In the spectrum diagrams of FIG. 10, the horizontal axis is the wavelength and the vertical axis is the light emission intensity. In the present embodiment, the light-emitting element layer 6 and the optical compensation layer 8 have a design determined by the change in light emission intensity due to the viewing direction and the change in light emission intensity due to compensation for the change in color level as illustrated in FIG. 10. Thus, the change in color level and the change in brightness due to different viewing directions of the display surface of the display device 2 can both be compensated for.

Figure 11:
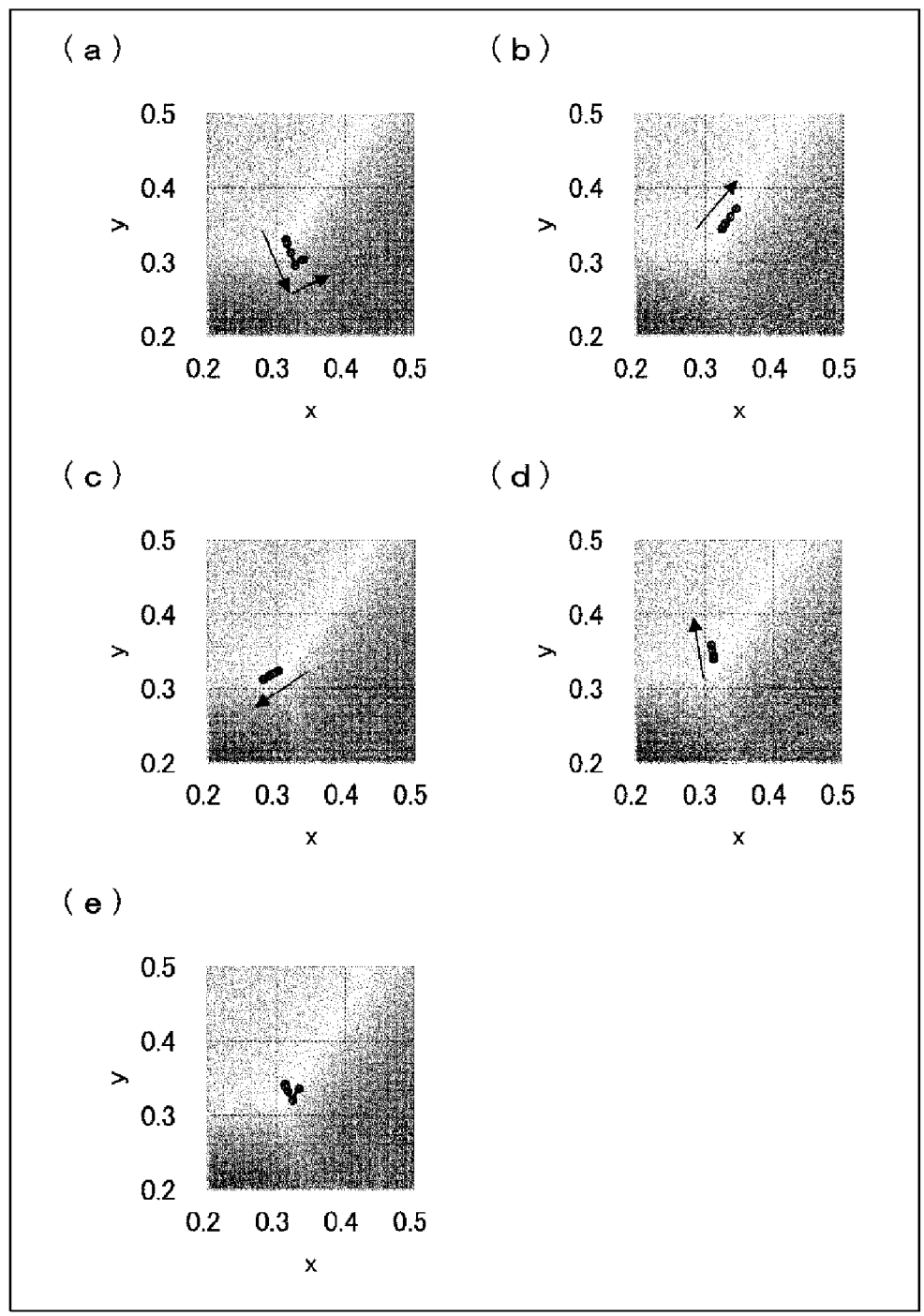
FIG. 11 is an x-y chromaticity coordinate diagram for describing compensation for the change in color level of the display device according to the second embodiment of the present disclosure.

FIG. 11 illustrates chromaticity diagrams of the display device 2 according to the present embodiment corresponding to FIG. 6. By comparing (a) of FIG. 11 and (e) of FIG. 11, it can be seen that the change in color level due to different viewing directions of the display surface of the display device 2 can be compensated for in the present embodiment as well.

Third Embodiment

Figure 12:
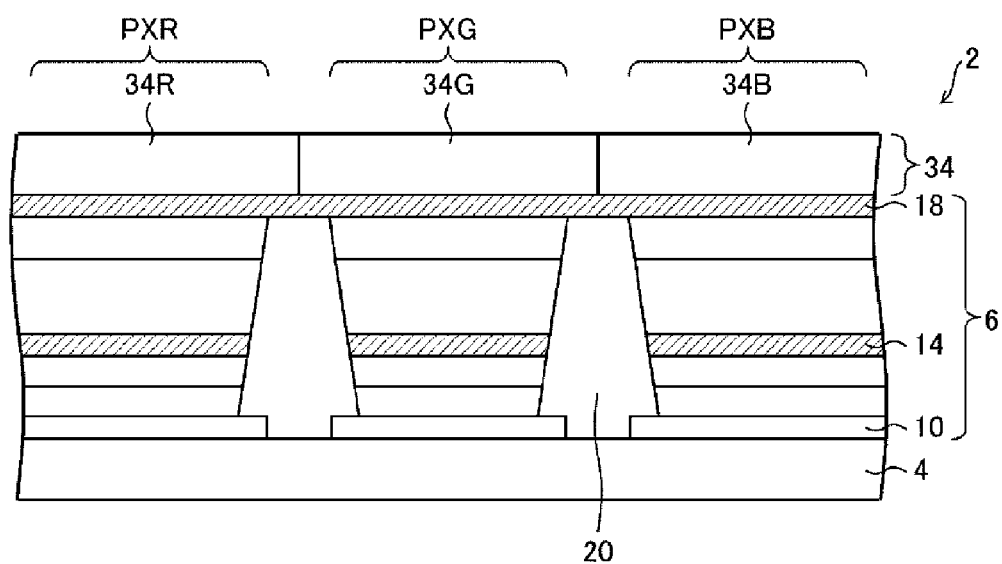
FIG. 12 is a schematic view illustrating a display device according to a third embodiment of the present disclosure.

FIG. 12 is a cross-sectional view illustrating a display device according to the present embodiment. The display device 2 according to the present embodiment has a different configuration from that of the display device 2 described above only in that an optical compensation layer 34 is provided instead of the optical compensation layer 8. The optical compensation layer 34 is formed individually for each one of the subpixels PX. For example, in the present embodiment, as illustrated in FIG. 12, an optical compensation layer 34R is formed for a subpixel PXR that emits red light, an optical compensation layer 34G is formed for a subpixel PXG that emits green light, and an optical compensation layer 34B is formed for a subpixel PXB that emits blue light, respectively. Note that the same type of optical compensation layer 34 may be formed for the subpixels PX that emits the same color of light.

In the present embodiment, the optical compensation layers 34R, 34G, 34B each have a different design from the optical compensation layers 34R, 34G, 34B that formed on the subpixels PX that emit light of a different color. For example, the optical compensation layers 34R, 34G, 34B are designed for appropriate compensation for light from the corresponding subpixels PXR, PXG, PXB.

For example, the retardation at the optical compensation layers 34 differ depending on the wavelength of light. Thus, the thicknesses of the optical compensation layers 34 are designed on a subpixel PX-by-subpixel PX basis. Also, the change in color level due to different viewing directions of the display surface of the optical compensation layers 34 differs depending on the wavelength of light. Thus, the absorption properties (absorption waveform, absorption strength, anisotropy) of the dichroic pigments 32 in the optical compensation layers 34 may be designed for each subpixel PX.

In the display device 2 according to the present embodiment, optical compensation appropriate for the wavelength of light from the subpixel PX can be achieved for each subpixel PX. Thus, an effect of further improving display quality can be achieved.

Fourth Embodiment

Figure 13:
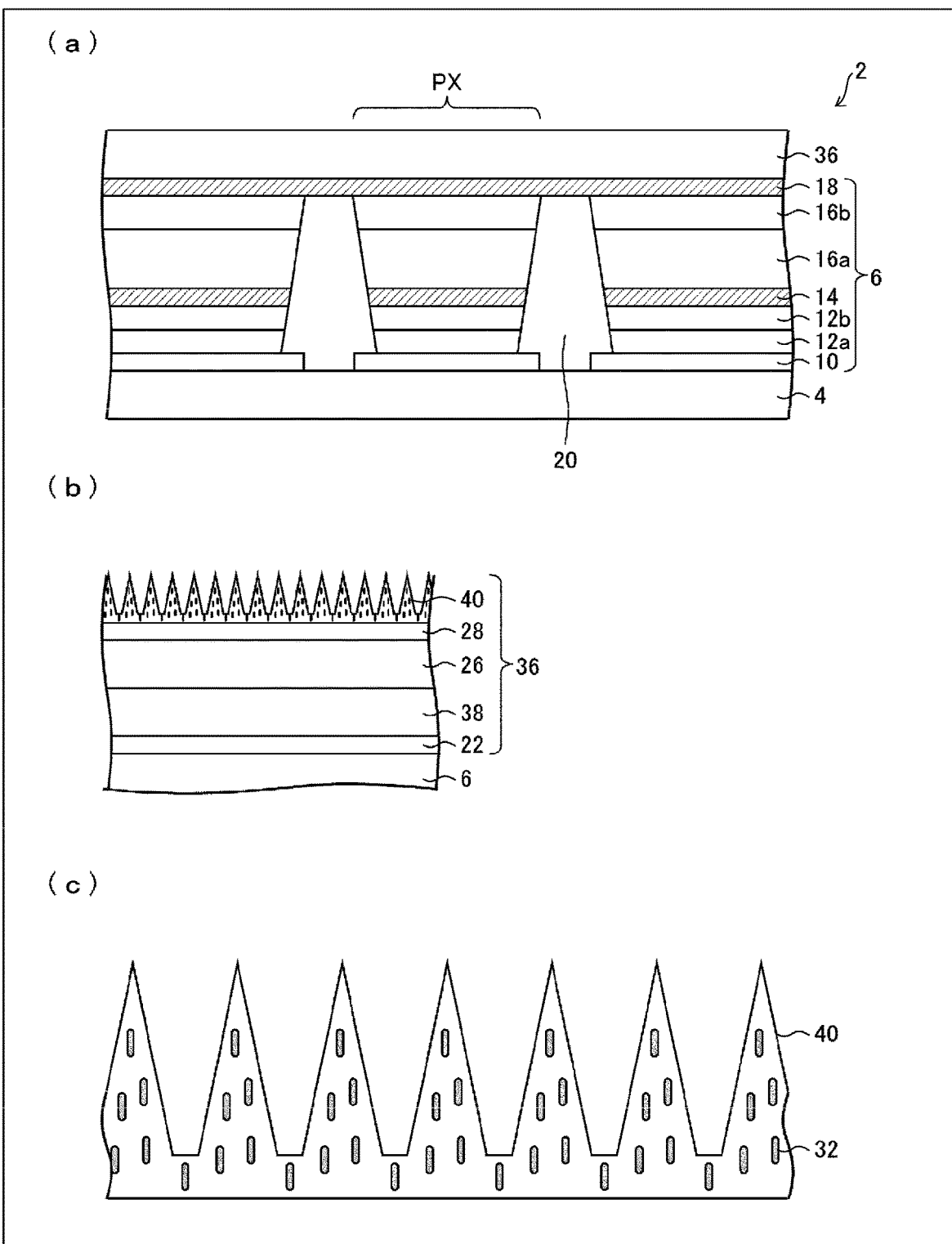
FIG. 13 is a schematic view illustrating a display device according to a fourth embodiment of the present disclosure.

FIG. 13 is a view illustrating a display device according to the present embodiment. (a) of FIG. 13 is a cross-sectional view of the display device 2 according to the present embodiment. (b) of FIG. 13 is a cross-sectional view illustrating in further detail an optical compensation layer 36 at one subpixel PX of the display device 2. (c) of FIG. 13 is a cross-sectional view for describing in further detail a moth-eye film 40 of the optical compensation layer 36.

The display device 2 according to the present embodiment has a different configuration from that of the display device 2 according to the previous embodiment only in that the optical compensation layer 36 is provided. The optical compensation layer 36 is different from the optical compensation layer 8 only in that a liquid crystal layer 38 is provided instead of the liquid crystal layer 24 and the moth-eye film 40 is disposed above the polarizer 28.

In contrast to the liquid crystal layer 24, the liquid crystal layer 38 may not include the dichroic pigments 32. Instead, the dichroic pigments 32 are aligned in the moth-eye film 40 with their longitudinal direction arranged to be perpendicular to the display surface of the display device 2. The dichroic pigments 32 may be aligned utilizing the horizontal alignment of the moth-eye film 40.

The moth-eye film 40 includes, as its structure, a plurality of projections on an upper face. The plurality of projections have a shape that tapers from the lower face of the moth-eye film 40 upwards. Thus, the apparent shape of the moth-eye film 40 can be understood have a higher refractive index from the top downwards toward the lower face. Without having an interface at which the refractive index dramatically changes, the light traveling toward the moth-eye film 40 being reflected at the moth-eye film 40 is reduced. Thus, the display device 2 can further reduce external light reflection.

The display device 2 according to the present embodiment can further reduce external light reflection and achieve an effect of reducing the change in color level of the display surface due to different viewing directions of the display surface. Thus, the display device 2 with improved display quality can be provided.

Fifth Embodiment

Figure 14:
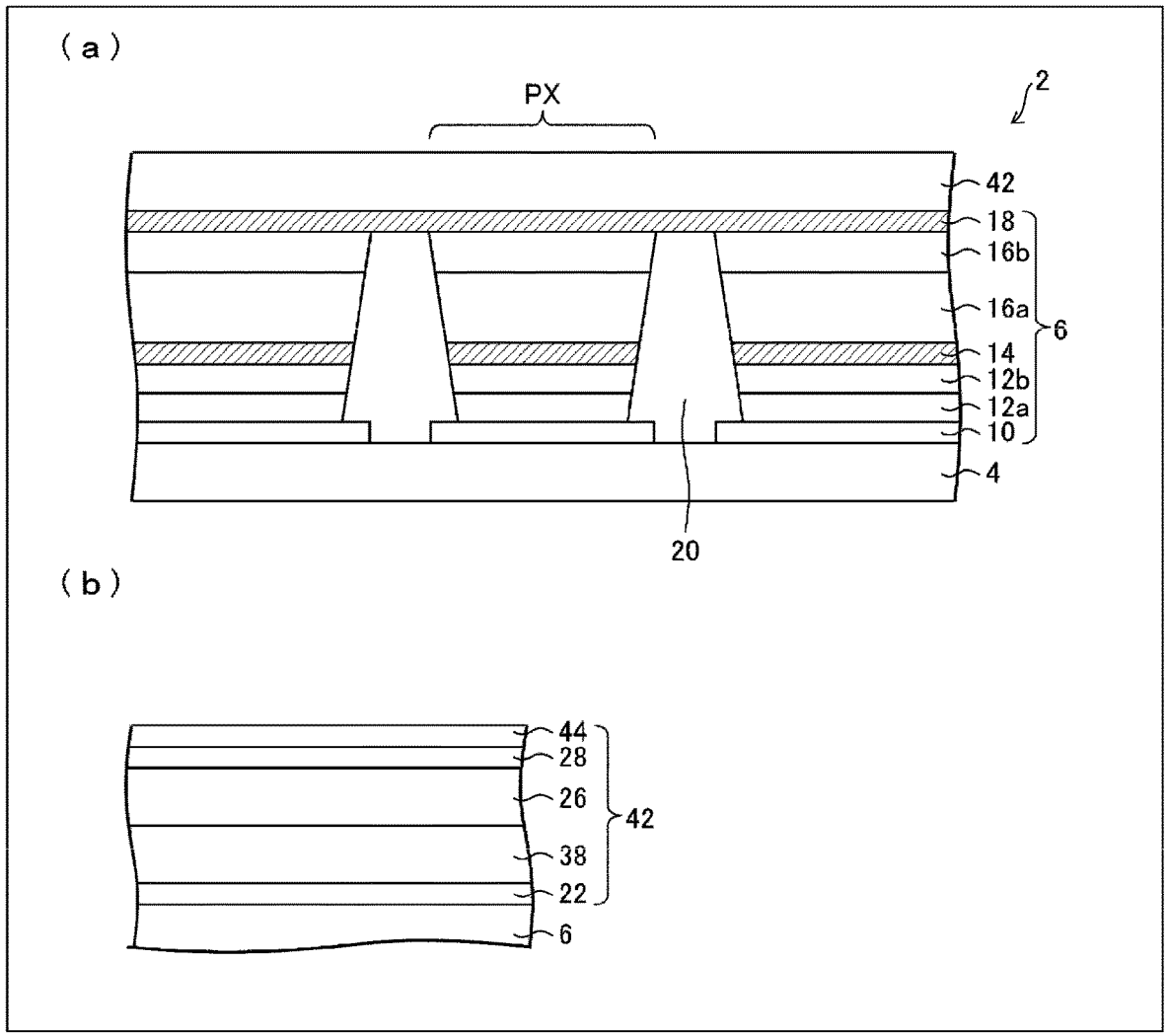
FIG. 14 is a schematic view illustrating a display device according to a fifth embodiment of the present disclosure.

FIG. 14 is a view illustrating a display device according to the present embodiment. (a) of FIG. 14 is a cross-sectional view of the display device 2 according to the present embodiment. (b) of FIG. 14 is a cross-sectional view illustrating in further detail an optical compensation layer 42 at one subpixel PX of the display device 2.

The display device 2 according to the present embodiment has a different configuration from that of the display device 2 according to the previous embodiment only in that the optical compensation layer 42 is provided. The optical compensation layer 42 is different from the optical compensation layer 36 only in that a louver film 44 is disposed above the polarizer 28.

The louver film 44 has a function of allowing light of a specific wavelength to pass through it if an angle, which is formed by the surface of the louver film 44 and the direction perpendicular thereto, is within a range and blocks light if the angle is outside this range. In this way, the louver film 44 is designed so that the wavelength of the light blocked by the louver film 44 corresponds to the wavelength absorbed by the dichroic pigments 32 described above. That is, when the display surface is viewed from directly opposite, there is no effect on display viewed from the front, and by the light traveling in a diagonal direction passing through the louver film 44 at an incline, coloration is compensated for. Thus, the display device 2 according to the present embodiment has the same effects as that of the previous embodiment. Furthermore, by also including the louver film 44 that blocks light of all wavelength outside a certain angle range, the display device 2 can have an effect of preventing peeping.

Note that a configuration in which the louver film 44 is disposed above the polarizer 28 was described above. However, the position of the louver film 44 is not limited thereto and is only required to be on the display surface side of the light-emitting element layer 6. Also, though not mentioned in the description described above, the liquid crystal layer 38 may not be provided. Furthermore, the louver film 44 may be a semi-transparent color. In this case, the color of the louver film 44 may be a color that compensates for the dependence of the viewing angle of the luminescent color of the light-emitting element.

Figure 15:
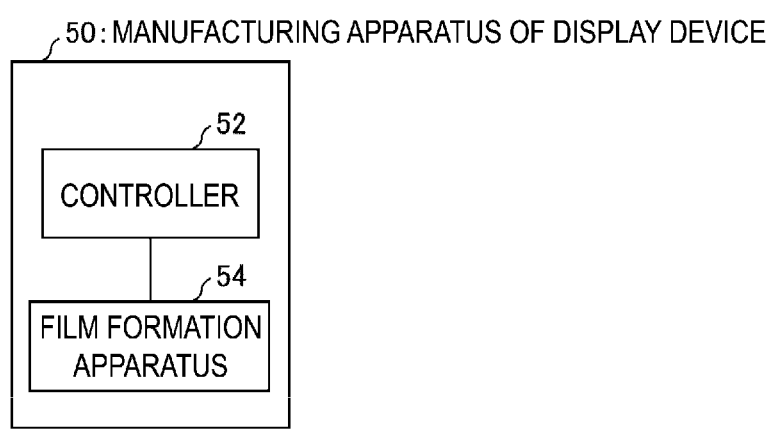
FIG. 15 is a block diagram illustrating a manufacturing apparatus of a display device according to the embodiments of the present disclosure.

The display device 2 according to the embodiments described above may be manufactured to include, in order from the lower layer, the substrate 4, the light-emitting element layer 6, and the optical compensation layers 8, 34, 36, 42. Also, the display device 2 according to the embodiments described above may be manufactured by a manufacturing apparatus 50 of a display device illustrated in the block diagram of FIG. 15. The manufacturing apparatus 50 of a display device may include a controller 52 and a film formation apparatus 54. The controller 52 may control the film formation apparatus 54. The film formation apparatus 54 may form each layer of the display device 2.

Supplement

A display device according to a first aspect includes a light-emitting element layer including a light-emitting layer including a light-emitting element, a first electrode disposed below the light-emitting layer, and a second electrode disposed above the light-emitting layer, wherein an optical compensation layer is disposed above the light-emitting element layer, the optical compensation layer being configured to compensate for prevention of external light reflection at a display surface and compensate for change in color level of the display surface due to different viewing directions of the display surface.

In a second aspect, the light-emitting element layer has a cavity structure formed by the first electrode and the second electrode.

In a third aspect, in an optical path in a direction perpendicular to the display surface, a resonant wavelength produced by the cavity structure is on a longer wavelength side of a wavelength of light from the light-emitting layer with maximum intensity.

In a fourth aspect, the light-emitting element layer includes a plurality of subpixels and a cover film disposed above the first electrode and including openings at each one of the plurality of subpixels.

In a fifth aspect, the optical compensation layer is common layer for the plurality of subpixels.

In a sixth aspect, the optical compensation layer is individually provided for each one of the plurality of subpixels, and, corresponding to a wavelength of light from one of the plurality of subpixels, at least one of the optical compensation layers compensates for the change in color level.

In a seventh aspect, the optical compensation layer includes a liquid crystal layer, a retardation film, and a polarizer and compensates for the prevention of external light reflection.

In an eighth aspect, the optical compensation layer further includes a dichroic pigment and compensates for the change in color level.

In a ninth aspect, the dichroic pigment compensates for dependence on viewing angle of luminescent color of light emitted from the light-emitting element layer.

In a tenth aspect, the liquid crystal layer includes the dichroic pigment.

In an eleventh aspect, an added amount of the dichroic pigment in the liquid crystal layer is 10 wt. % or less.

In a twelfth aspect, a product of a thickness of the liquid crystal layer and a refractive index anisotropy of liquid crystal of the liquid crystal layer is from 20 nm to 100 nm.

In a thirteenth aspect, the optical compensation layer further includes a moth-eye film, and the moth-eye film includes the dichroic pigment.

In a fourteenth aspect, the optical compensation layer includes a plurality of types of the dichroic pigment.

In a fifteenth aspect, the optical compensation layer includes a louver film, a retardation film, and a polarizer and compensates for the change in color level.

In a sixteenth aspect, the optical compensation layer further includes a liquid crystal layer.

In a seventeenth aspect, the louver film is a semi-transparent color.

In an eighteenth aspect, the color of the louver film compensates for dependence on viewing angle of luminescent color of the light-emitting element layer.

A manufacturing method of a display device of a nineteenth aspect includes forming a light-emitting element layer including a light-emitting layer including a light-emitting element, a first electrode disposed below the light-emitting layer, and a second electrode disposed above the light-emitting layer, and forming an optical compensation layer disposed above the light-emitting element layer, the optical compensation layer being configured to compensate for prevention of external light reflection at a display surface and compensate for change in color level of the display surface due to different viewing directions of the display surface.

In a twentieth aspect, the optical compensation layer includes a liquid crystal layer including a dichroic pigment, and forming the optical compensation layer includes adding the dichroic pigment in the liquid crystal layer and applying the liquid crystal layer to a target object.

A manufacturing apparatus of a display device of a twenty-first aspect includes a film formation apparatus of a light-emitting element layer including a light-emitting layer including a light-emitting element, a first electrode disposed below the light-emitting layer, and a second electrode disposed above the light-emitting layer and of an optical compensation layer disposed above the light-emitting element layer, the optical compensation layer being configured to compensate for prevention of external light reflection at a display surface and compensate for change in color level of the display surface due to different viewing directions of the display surface.

The present disclosure is not limited to each of the embodiments described above, and various modifications may be made within the scope of the claims. Embodiments obtained by appropriately combining technical approaches disclosed in each of the different embodiments also fall within the technical scope of the present disclosure. Moreover, novel technical features can be formed by combining the technical approaches disclosed in the embodiments.

The invention claimed is:

1. A display device, comprising
a light-emitting element layer including:
   a light-emitting layer including a light-emitting element,
   a first electrode disposed below the light-emitting layer, and
   a second electrode disposed above the light-emitting layer,
wherein the light-emitting element layer has a cavity structure formed by the first electrode and the second electrode,
an optical compensation layer is disposed above the cavity structure, the optical compensation layer being configured to compensate for prevention of external light reflection at a display surface and compensate for change in color level of the display surface due to different viewing directions of the display surface,
the optical compensation layer includes a dichroic pigment and compensates for the change in color level,
the dichroic pigment has an elongated shape,
the dichroic pigment is configured to absorb more light having a component of polarized light parallel with a longitudinal direction of the dichroic pigment than light having a component of other polarized light, and
the dichroic pigment is placed in such a manner that the longitudinal direction is perpendicular to the display surface.

2. The display device according to claim 1,
wherein, in an optical path in a direction perpendicular to the display surface, a resonant wavelength produced by the cavity structure is on a longer wavelength side of a wavelength of light from the light-emitting layer with maximum intensity.

3. The display device according to claim 1,
wherein the light-emitting element layer includes a plurality of subpixels and a cover film disposed above the first electrode and including openings at each one of the plurality of subpixels.

4. The display device according to claim 3,
wherein the optical compensation layer is common layer for the plurality of subpixels.

5. The display device according to claim 3,
wherein the optical compensation layer is individually provided for each one of the plurality of subpixels, and, corresponding to a wavelength of light from one of the plurality of subpixels, at least one of the optical compensation layers compensates for the change in color level.

6. The display device according to claim 1,
wherein the optical compensation layer includes a liquid crystal layer, a retardation film, and a polarizer and compensates for the prevention of external light reflection.

7. The display device according to claim 6,
wherein the dichroic pigment is added to the liquid crystal layer.

8. The display device according to claim 7,
wherein an added amount of the dichroic pigment in the liquid crystal layer is 10 wt. % or less.

9. The display device according to claim 7,
wherein a product of a thickness of the liquid crystal layer and a refractive index anisotropy of liquid crystal of the liquid crystal layer is from 20 nm to 100 nm.

10. The display device according to claim 6,
wherein the optical compensation layer further includes a moth-eye film, and
the dichroic pigment is added to the moth-eye film.

11. The display device according to claim 1,
wherein the dichroic pigment compensates for dependence on viewing angle of luminescent color of light emitted from the light-emitting element layer.

12. The display device according to claim 1,
wherein the optical compensation layer includes a plurality of types of the dichroic pigment.

13. A display device, comprising
a light-emitting element layer including:
   a light-emitting layer including a light-emitting element,
   a first electrode disposed below the light-emitting layer, and
   a second electrode disposed above the light-emitting layer,
wherein the light-emitting element layer has a cavity structure formed by the first electrode and the second electrode,
an optical compensation layer is disposed above the cavity structure, the optical compensation layer being configured to compensate for prevention of external light reflection at a display surface and compensate for change in color level of the display surface due to different viewing directions of the display surface,
the optical compensation layer includes a louver film, a retardation film, and a polarizer and compensates for the change in color level,
the louver film is a semi-transparent color, and
the color of the louver film compensates for dependence on viewing angle of luminescent color of the light-emitting element layer.

14. The display device according to claim 13,
wherein the optical compensation layer further includes a liquid crystal layer.

15. A manufacturing method of a display device, comprising:
forming a light-emitting element layer including a light-emitting layer including a light-emitting element, a first electrode disposed below the light-emitting layer, and a second electrode disposed above the light-emitting layer, the light-emitting element layer having a cavity structure; and
forming an optical compensation layer disposed above the cavity structure, the optical compensation layer being configured to compensate for prevention of external light reflection at a display surface and compensate for change in color level of the display surface due to different viewing directions of the display surface,
wherein forming the optical compensation layer comprises
   forming the optical compensation layer in such a manner that the optical compensation layer includes a dichroic pigment, the dichroic pigment having an elongated shape, the dichroic pigment being configured to absorb more light having a component of polarized light parallel with a longitudinal direction of the dichroic pigment than light having a component of other polarized light, the dichroic pigment being placed in such a manner that the longitudinal direction is perpendicular to the display surface.

* * * * *